US009197168B2

(12) United States Patent
Al-Qaq et al.

(10) Patent No.: US 9,197,168 B2
(45) Date of Patent: Nov. 24, 2015

(54) AMPLITUDE MODULATION TO PHASE MODULATION (AMPM) DISTORTION COMPENSATION

(71) Applicant: MStar Semiconductor, Inc., Hsinchu Hsien (TW)

(72) Inventors: Wael Al-Qaq, Oak Ridge, NC (US); Dennis Mahoney, Greensboro, NC (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 198 days.

(21) Appl. No.: 13/948,349

(22) Filed: Jul. 23, 2013

(65) Prior Publication Data

US 2015/0028946 A1 Jan. 29, 2015

(51) Int. Cl.
*H04B 1/04* (2006.01)
*H03F 1/32* (2006.01)
*H03F 3/24* (2006.01)

(52) U.S. Cl.
CPC ............ *H03F 1/3241* (2013.01); *H03F 1/3288* (2013.01); *H03F 3/24* (2013.01); *H03F 2200/102* (2013.01)

(58) Field of Classification Search
CPC ...... H04B 1/04; H04B 1/0475; H04B 10/548; H04B 2001/0408; H04B 2001/0425; H04B 2001/0433; H03F 1/0266; H03F 1/0272; H03F 1/3241; H03F 1/3247; H03F 1/3282; H03F 1/3288; H03F 2200/336; H03F 2200/393; H03F 2200/451; H03F 2201/3212; H03F 2201/3233

USPC ............ 455/63.1, 67.11, 67.13, 114.2, 114.3, 455/115.1, 115.2, 127.1, 127.2; 375/296, 375/297; 330/149

See application file for complete search history.

(56) References Cited

U.S. PATENT DOCUMENTS

| | | | | |
|---|---|---|---|---|
| 6,943,627 | B2 * | 9/2005 | Leyonhjelm et al. | 330/149 |
| 7,279,972 | B2 * | 10/2007 | Smithson | 330/149 |
| 8,358,169 | B2 * | 1/2013 | Sen et al. | 330/149 |
| 8,391,808 | B2 * | 3/2013 | Gonikberg et al. | 455/114.3 |
| 8,913,689 | B2 * | 12/2014 | Kim et al. | 375/296 |
| 8,976,895 | B2 * | 3/2015 | Sombrin et al. | 375/296 |
| 2011/0102080 | A1 | 5/2011 | Chatterjee et al. | |
| 2013/0285740 | A1 * | 10/2013 | Cummins et al. | 330/2 |

* cited by examiner

*Primary Examiner* — Quochien B Vuong
(74) *Attorney, Agent, or Firm* — Edell, Shapiro & Finnan, LLC

(57) ABSTRACT

To generate amplitude modulation to phase modulation (AMPM) predistortion data that compensates for phase distortion in a power amplifier of a communication device, a test signal is amplified via the power amplifier. The amplified test signal is combined, by wave superposition, with a reference oscillator signal into a resultant signal. The resultant signal is an outcome of interference between the amplified test signal and the reference oscillator signal. The resultant signal power is measured using envelope information and, from the measurement, a predistortion phase shift is determined that when applied to the test signal maximizes the interference between the amplified test signal and the reference oscillator signal. AMPM predistortion data is generated to correspond with the predistortion phase shift.

20 Claims, 3 Drawing Sheets

AMPLITUDE MODULATION TO PHASE MODULATION (AMPM) DISTORTION COMPENSATION

TECHNICAL FIELD

The present disclosure relates to compensation of amplitude modulation to phase modulation (AMPM) distortion in power amplifiers of radio-frequency (RF) transmitters.

BACKGROUND

Trends in wireless communication technology continue towards ever higher data transfer rates in ever more tightly-packed frequency bands. Spectral efficiency in modern radio-frequency (RF) communication devices, e.g., cellular phones, tablet computers, laptop computers, etc., is achieved by adhering to stringent specifications on a number of system variables, many of which are interdependent. Not the least of these specifications is that on linearity of the RF power amplifier in the device's transmitter. Typically, such RF power amplifiers are operated at or near saturation and, consequently, considerable distortion is inflicted on the amplified signal. Amplitude modulation to amplitude modulation (AMAM) distortion results in gain compression that causes a higher bit error rate at the receiver. Amplitude modulation to phase modulation (AMPM) distortion results in constellation skew at the receiver that causes decoding/demodulation errors. It is thus increasingly common to predistort transmitter data in both amplitude and phase prior to amplification so that the amplified signal tracks linearly with the power amplifier's input signal.

Predistortion data are obtained through a calibration procedure and, since every power amplifier is slightly different, even between amplifiers of like design and manufacturing process, calibration is performed on every device prior to shipping from the manufacturer. Thus, considerable expenditure of design and engineering resources have sought, and continue to seek mechanisms by which calibration time can be shortened and/or by which calibration can be performed in the field. To that end, many manufacturers have begun to incorporate calibration circuitry into the communication device, including circuitry for test signal generation, signal probing and measuring, signal processing and analysis, parameter generation and process variable assignment, etc. Quite obviously, the added circuitry increases the device's complexity, size and cost. Accordingly, development of smaller, simpler, but nevertheless accurate calibration circuits and concomitant calibration techniques are ongoing.

SUMMARY

To generate amplitude modulation to phase modulation (AMPM) predistortion data that compensates for phase distortion in a power amplifier of a communication device, a test signal is amplified via the power amplifier. The amplified test signal is combined, by wave superposition, with a reference oscillator signal into a resultant signal. The resultant signal is an outcome of interference between the amplified test signal and the reference oscillator signal. The resultant signal is measured and, from the measurement, a predistortion phase shift is determined that when applied to the test signal maximizes the interference between the amplified test signal and the reference oscillator signal. AMPM predistortion data is generated to correspond with the predistortion phase shift.

DESCRIPTION OF EXAMPLE EMBODIMENTS

Figure 1:
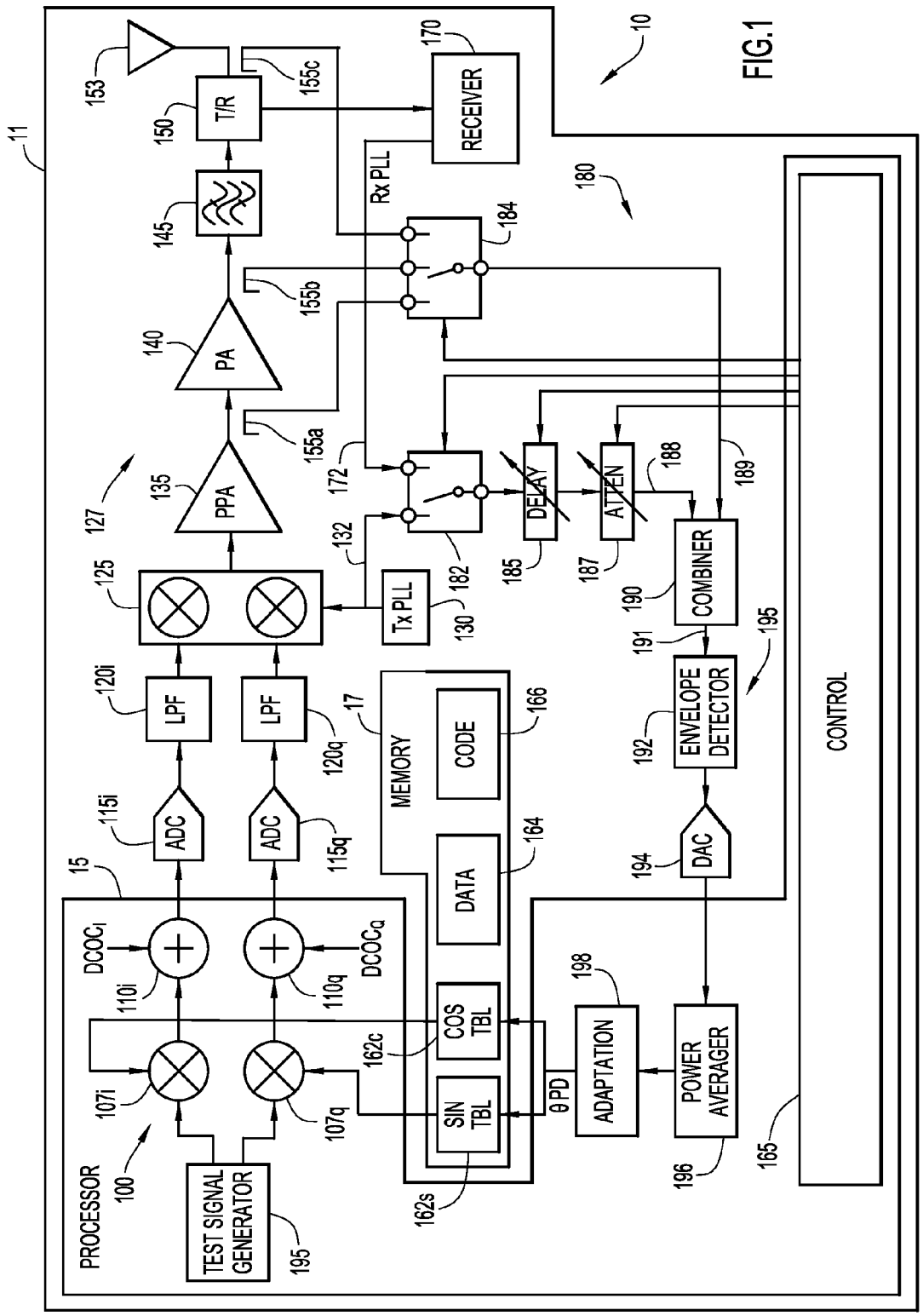
FIG. 1 is a schematic block diagram of a communication device in which the present general inventive concept can be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments Additionally, mathematical expressions are contained herein and those principles conveyed thereby are to be taken as being thoroughly described therewith. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

The figures described herein include schematic block diagrams illustrating various interoperating functional modules. Such diagrams are not intended to serve as electrical schematics and interconnections illustrated are intended to depict signal flow, various interoperations between functional components and/or processes and are not necessarily direct electrical connections between such components. Moreover, the functionality illustrated and described via separate components need not be distributed as shown, and the discrete blocks in the diagrams are not necessarily intended to depict discrete electrical components.

The techniques described herein are directed to determining amplitude modulation to phase modulation (AMPM) predistortion weights to compensate for phase distortion in a power amplifier. Upon review of this disclosure and appreciation of the concepts disclosed herein, the ordinarily skilled artisan will recognize other distortion compensation contexts in which the present inventive concept can be applied. The scope of the present invention is intended to encompass all such alternative implementations.

FIG. 1 is a schematic block diagram of a communication device 10 by which the present invention can be embodied.

Exemplary communication device 10 includes a transmitter 100, a receiver 170 and a calibration circuit 180 assembled in a common housing, representatively illustrated by border 11. The present invention is not limited to a particular configuration or architecture used to implement communication device 10; those skilled in the art will recognize numerous circuit configurations and components other than those described herein by which the present invention can be embodied without deviating from the spirit and intended scope thereof.

Communication device 10 may utilize a processor 15 to implement various signal processing and control functions. For example, processor 15 may implement digital baseband processing on behalf of both transmitter 100 and receiver 170, including, but not limited to, encoding/decoding, modulation/demodulation, filtering, and compensation of signals in transmitter 100 and receiver 170 for circuit variations, e.g., in-phase and quadrature (IQ) mismatch, local oscillator (LO) leakage, power amplifier amplitude and phase distortion, etc. Those skilled in the radio arts will recognize and comprehend digital baseband processing implementations on a processor and, as such, implementation details thereof that are conventional and well-understood will be omitted for purposes of conciseness, unless such description would promote a better understanding of the present invention. Additionally, it is to be understood that digital baseband processing features not explicitly described herein may nevertheless be incorporated in embodiments of the present invention as appropriate to realize a fully functional communication device.

Processor 15 may be realized in a wide variety of circuit configurations and circuit components including discrete and integrated logic components, fixed and programmable logic circuits, e.g., application specific integrated circuits (ASICs), field programmable gate arrays (FPGAs), complex programmable logic devices (CPLDs), digital signal processors microcontrollers and microprocessors, and combinations of the foregoing devices. In certain embodiments, processor 15 may implement functionality through execution of suitably programmed processor instructions stored in a memory, such as in code segment 166 of memory 17. Memory 17 may be realized through suitable volatile or persistent storage devices, e.g., semiconductor random access memory (RAM) and read-only memory (ROM), semiconductor flash memory, magnetic storage media, optical storage media, etc.

Various functions and processes implemented on communication device 10 may be controlled by a control processor 165. Control processor 165 may be a circuit dedicated to realize the control functionality or may be realized by a process executing on a processor, such as processor 15. Control processor 165 may perform conventional and well-understood control functions that coordinate operations typical of such communication devices, including, but not limited to, user interface operation, program execution and control, memory allocation and access control, interrupt handling, signal and data bus arbitration, clock and timer signal control and file handling. Additionally, control processor 165 may operate to execute, monitor and control the AMPM predistortion data generation technique described herein.

Transmitter 100 conveys signals through a signal processing chain from a modulator/demodulator (MODEM, not illustrated) at one end thereof to transmit/receive (T/R) switch 150 at the other end thereof. A complex digital data signal having in-phase (I) and quadrature (Q) signal components may be generated by the aforementioned digital baseband processing. The digital baseband signal may be provided to digital-to-analog converters (DACs) 115$i$ and 115$q$, representatively referred to herein as DAC(s) 115, by which an analog baseband signal is produced. The analog baseband signal may be provided to low-pass reconstruction filters 120$i$, 120$q$, representatively referred to herein as low-pass filter(s) (LPFs) 120, and then to an upconverting modulator, or simply upconverter 125. Upconverter 125 receives a transmitter local oscillator (LO) signal from a transmitter phase-locked loop (PLL) oscillator 130 at a frequency corresponding to the applicable carrier frequency. Accordingly, upconverter 125 may include one or more RF mixer circuits for each of the I and Q signal channels to carry out the upconversion, as well as one or more filters and signal combining circuitry. When so embodied, the output of upconverter 125 is a band-limited analog signal centered at the transmitter carrier frequency, which may then be provided to an output stage 127 comprising a pre-power amplifier 135, a power amplifier 140, a bandpass filter 145, T/R switch 150 and an antenna 153. The signal processing chain of transmitter 100 may include fewer or a greater number of processing stages than those illustrated and described in this example and may be constructed to perform signal processing operations in an order other than that described in this example. The scope of the present invention is intended to encompass such variants and alternatives.

Embodiments of the present invention realize a technique by which AMPM predistortion data are produced to compensate for phase distortion in output stage 127, particularly by power amplifier 140. To that end, calibration circuit 180 includes a test signal generator 195 to produce a test signal that is injected into the transmitter signal processing chain. In certain embodiments, test signal generator 195 generates digital data words that correspond to power levels of power amplifier 140. A range of power levels can be processed to generate a set of AMPM predistortion weights. For example, test signal generator 195 may generate digital data words that realize a ramped signal profile and the calibration technique described herein may start at a lowest power level and incrementally increase the power level to a highest power level. At various increments in the power level, the calibration process may generate AMPM predistortion data for that power level.

The digital data produced by test signal generator 195 may be provided to respective multipliers 107$i$ and 107$q$, representatively referred to herein as multiplier(s) 107. As explained in more detail below, multipliers 107 apply candidate phase shifts to the test signal data with the goal of identifying a final phase shift value when an acceptability criterion is met. The phase-shifted test signal data may be provided to adders 110$i$ and 110$q$, representatively referred to herein as adder(s) 110, whereby the data words are compensated for LO leakage. In certain embodiments, DC offset correction (DCOC) weights $DCOC_I$ and $DCOC_Q$ are computed by a calibration process targeting LO leakage and are added to the corresponding I and Q digital data words of the test signal. Eliminating DC offset during the AMPM calibration process affords greater accuracy in the AMPM predistortion data, particularly when computing the AMPM predistortion weights are based on measurements made at or near zero frequency.

The phase-shifted and DC compensated test signal data may be processed by remaining stages of the transmitter signal processing chain in the manner describe above. The resulting transmitter signal, i.e., the signal conveyed through the transmitter signal processing chain, may be sampled from a suitable location in the transmitter signal processing chain, such as at the output of power amplifier 140. In certain embodiments, one or more couplers 155$a$-155$c$, representatively referred to herein as coupler(s) 155, may be installed at various points in output stage 127 to extract a sample of the RF transmitter signal. In certain embodiments, the location along the transmitter signal processing chain at which the RF transmitter signal is sampled is established by a switch 184. Switch 184 may be compelled into one of a plurality of connection states by, for example, control processor 165 to connect one of the couplers 155 to calibration circuit 180. For purposes of explanation and not limitation, it is to be assumed in the following description that coupler 155b is connected to combiner 190, which is described in paragraphs that follow, either directly or through switch 184. The RF transmitter signal extracted from the transmitter signal processing chain by coupler 155 is referred to herein as amplified test signal 189.

Exemplary combiner 190 combines amplified test signal 189 with a reference oscillator signal 188 by wave superposition to produce a resultant signal 191. As those with a basic understanding of wave physics will recognize, wave superposition causes interference, both constructive interference and destructive interference, depending on phase alignment of the interfering signals. Thus, when the two signals 188 and 189 are aligned in phase, the output of combiner 190 is either minimum or maximum, depending on the construction of combiner 190 and the ports to which the respective input signals, i.e., reference oscillator signal 188 and amplified test signal 189, are connected. In certain embodiments, combiner 190 is coupled to reference oscillator signal 188 and amplified test signal 189 to produce resultant signal 191 at its maximum power level when maximum constructive interference is achieved in combiner 190 and to produce resultant signal 191 at its minimum power level when maximum destructive interference is achieved. In other embodiments, combiner 190 is coupled to reference oscillator signal 188 and amplified test signal 189 to produce resultant signal 191 at its maximum power level when maximum destructive interference is achieved in combiner 190 and to produce resultant signal 191 at its minimum power level when maximum constructive interference is achieved. Upon review of this disclosure, those skilled in RF circuit arts will understand and appreciate a variety of combiner architectures and circuit connections that can be used in conjunction with the present invention without departing from the spirit and intended scope thereof.

As illustrated in FIG. 1, either transmitter LO signal 132 or receiver LO signal 172 may be used as reference oscillator signal 188. Indeed, the present technique can be realized with any number of reference oscillators; the transmitter and receiver LO signals 132 and 172 are simply readily available in communication device 10, thus obviating the need for a dedicated oscillator for calibration. In certain embodiments, the LO signal used for AMPM predistortion calibration is selected by switch 182. Alternatively, switch 182 can be omitted and either transmitter PLL 130 or the receiver PLL (not illustrated) can be directly connected to provide reference oscillator signal 188. For purposes of explanation and not limitation, it is to be assumed in the following description that transmitter PLL 130 is connected to delay component 185, which is described in paragraphs that follow, either directly or through switch 182.

Delay component 185 delays transmitter LO signal 132 by a selected amount and thereby fixes a known phase offset in reference oscillator signal 188. Similarly, attenuator 187 attenuates transmitter LO signal 132 by a selected amount and thereby fixes a known power level in reference oscillator signal 188, such as a level that optimizes operation of envelope detector 192 for a given range of input signal levels. The delay in delay component 185 and attenuation level in attenuator 187 may be selected via suitable control signals generated by control processor 165. Additionally, the delay and attenuation level set by control processor 165 may be stored in memory, such as in data segment 164 of memory 17, and used to calculate AMPM predistortion calibration data, as described below.

The output of combiner 190 may be provided to a measurement circuit 195 that characterizes resultant signal 191, such as through an indication of the power level thereof. As illustrated in FIG. 1, exemplary measurement circuit includes an envelope detector 192 that produces an electrical signal that tracks the peaks in resultant signal 191. The envelope signal produced by envelope detector 192 may be provided to an analog-to-digital converter 194 which generates digital data indicative of the envelope signal and, subsequently, to a power averager 196 to filter out fluctuations in the envelope signal. The signal generated by measurement circuit 191 may be provided as a measurement signal or, equivalently, measurement data, to an adaptation processor 198, which performs an adaptive phase shift determination process, such as that described below.

Figure 2:
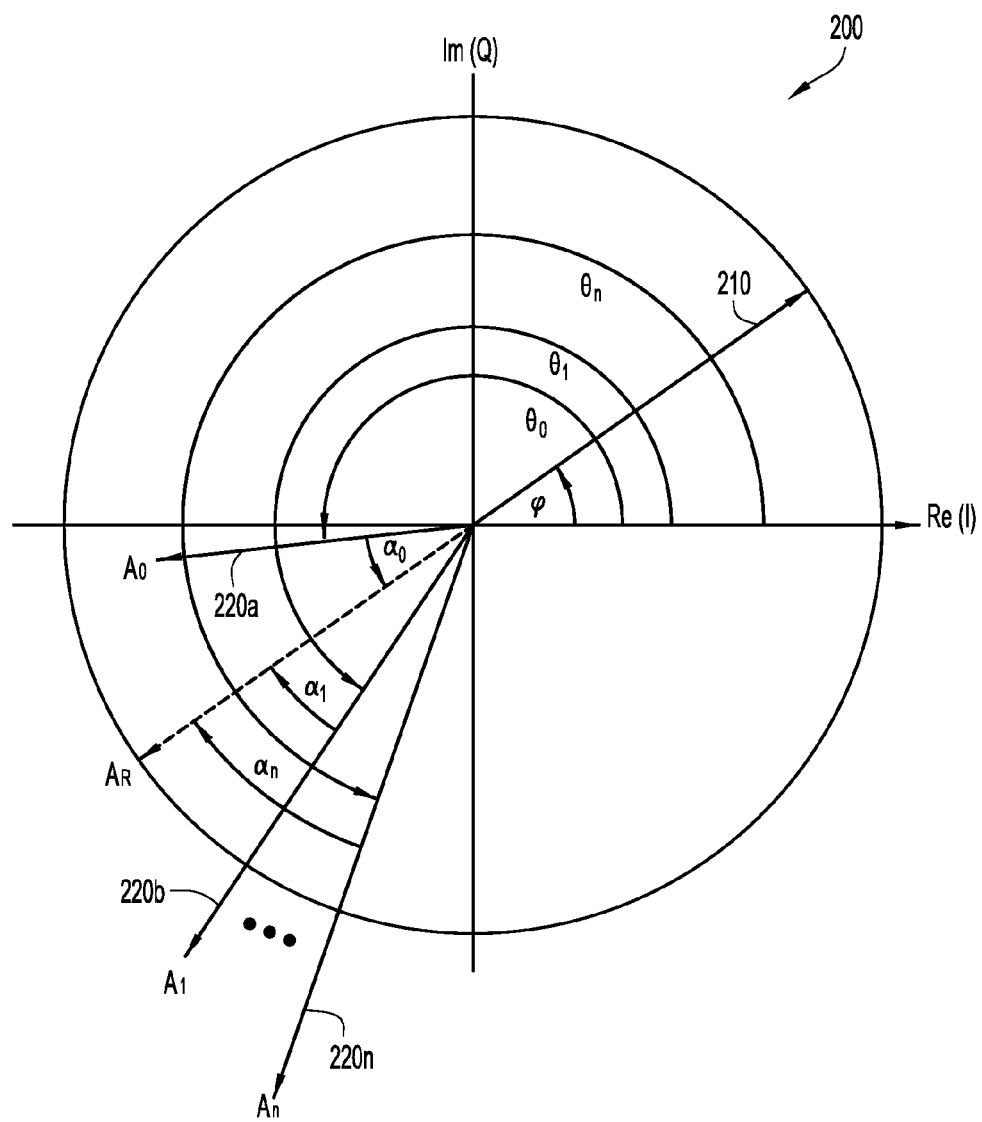
FIG. 2 is diagram of a complex number plane by which features of the present general inventive concept are explained.

FIG. 2 is a diagram of the complex number plane 200 on which reference oscillator signal 188 is graphically represented by reference vector 210 and amplified test signal 189 at various power levels is graphically represented by test vectors 220a-220n, representatively referred to herein as test vector(s) 220. Reference vector 210 lies in complex number plane 200 at an angle φ relative to the positive real axis, which is established in reference oscillator signal 188 by delay component 185. Also depicted on complex number plane 200 is a target vector 215 having magnitude $A_R$ equivalent to that of reference vector 210 and phase angle that is 180° out of phase with reference vector 210. As depicted in the diagram of FIG. 2, an amplified test signal 188 having amplitude and phase represented by target vector 215 and a reference oscillator signal 188 represented by reference vector 210 would be mutually cancelled by destructive interference in combiner 190, assuming that combiner 190 is of appropriate construction and that amplified test signal 189 and reference oscillator signal 188 are respectively provided to appropriate input ports of combiner 190. That is, under the foregoing conditions, resultant signal 191 would be zero.

In certain embodiments of the present invention, AMPM predistortion calibration data are generated across output power levels of power amplifier 140, such as by the ramped test signal described above. In FIG. 2, test vectors 220 graphically represent amplified test signal 189 resulting from such ramped operation; it is to be observed that $A_0<A_1<A_n$. It is to be observed as well that test vectors 220 are offset in phase from target vector 215 by respective angles $\alpha_0$-$\alpha_n$, representatively referred to herein as phase distortion angle(s) a, owing to phase distortion in power amplifier 140. Thus, embodiments of the present invention implement functionality that ascertains the phase distortion angles α and generates therefrom AMPM predistortion data that counteracts or linearizes the non-linear phase behavior of power amplifier 140. The AMPM predistortion data may be stored in memory 17, such as in data segment 164, in a format suitable for predistortion during normal operation of communication device 10, such as predistortion of MODEM data. Thus, the AMPM predistortion data may be indicative of an angle through which the normal communication data is to be shifted, such as through a phase shifter. Such angle may be absolute, i.e., referenced from the positive real axis of complex plane 200, such as illustrated by angles $\theta_0$-$\theta_n$, or alternatively, may be relative, such as an indication of phase distortion angle α. The AMPM predistortion data may also define predistortion weights that are applied to I and Q channel data, such as by multipliers 107 described above. Other predistortion data formats may be realized as well without departing from the spirit and intended scope of the present invention.

Returning to FIG. 1, at a given amplifier power level, adaptation processor 198 may generate a value for a candidate phase shift having unit amplitude and angle $\theta_{PD}$. The candidate phase shift may be converted from polar form to Cartesian form by way of sine and cosine lookup tables 162s and 162c, respectively. The Cartesian components of the candidate phase shift may be provided to respective multipliers 107 where they are multiplied by the corresponding I and Q digital test signal words. The phase-shifted test signal is transported through the transmitter signal processing chain and the corresponding amplified test signal 189 is sampled by coupler 155 and provided to combiner 190 where it is combined with reference oscillator signal 188. Resultant signal 191 corresponding to the present candidate phase shift $\theta_{PD}$ may be provided to adaptation processor 198 through measurement circuit 195, where it may serve as an error signal between the amplified test signal shifted by the candidate phase shift $\theta_{PD}$ and a "desired" signal, i.e., either signal 210 in FIG. 2 corresponding to maximum constructive interference with reference oscillator signal 188 or signal 215 in FIG. 2 corresponding to maximum destructive interference with reference oscillator signal 188.

In certain embodiments of the present invention, the difference in amplitude between the reference oscillator signal 188 and amplified test signal 189 is ignored for purposes of AMPM predistortion calibration. AMPM predistortion calibration in embodiments of the present invention proceeds regardless of the aforementioned amplitude difference and, accordingly, may be achieved using a single channel measurement circuit, i.e., only one envelope detector 192 and only one ADC 194, thereby reducing both the size and cost of the calibration circuit over traditional designs that employ multiple signal detectors and ADCs.

As can be understood from the diagram in FIG. 2, if the magnitudes of test vectors 220 are not compensated, i.e., made equivalent to $A_R$, then resultant signal 191 will always have finite non-zero power even when test vector 220 is aligned with target vector 215. Thus, resultant signal 191 will have a maximum amplitude when test vector 220 is aligned with reference vector 210, i.e., reference oscillator signal 188 and amplified test signal 189 are in phase and thus constructively interfere in combiner 190, and will have a minimum amplitude when test vector 220 is aligned with target vector 215, i.e., reference oscillator signal 188 and amplified test signal 189 are 180° out of phase and thus destructively interfere in combiner 190. Thus, the relationship between values of candidate phase shift $\theta_{PD}$ and the power level of resultant signal 191 is characterized by a convex line (or surface) having a global minimum at an angle $\theta=\phi+180°$ and a global maximum at $\theta=\phi$. Accordingly, adaptation processor 198 may implement a minimization or maximization technique to identify each phase distortion angle $\alpha$. Such minimization or maximization technique may be iterative and may base a next candidate phase shift $\theta_{PD}$ on an error signal, e.g., resultant signal 191, in the present iteration. For example, certain embodiments of the present invention implement a least mean square process that seeks a minimum error by a steepest descent approach, which, in the examples herein, occurs at $\alpha=0°$ or, equivalently, when $\theta=\phi+180°$. However, the present invention is not limited to any particular operation or set of operations by which minima and maxima can be located on a convex surface.

Figure 3:
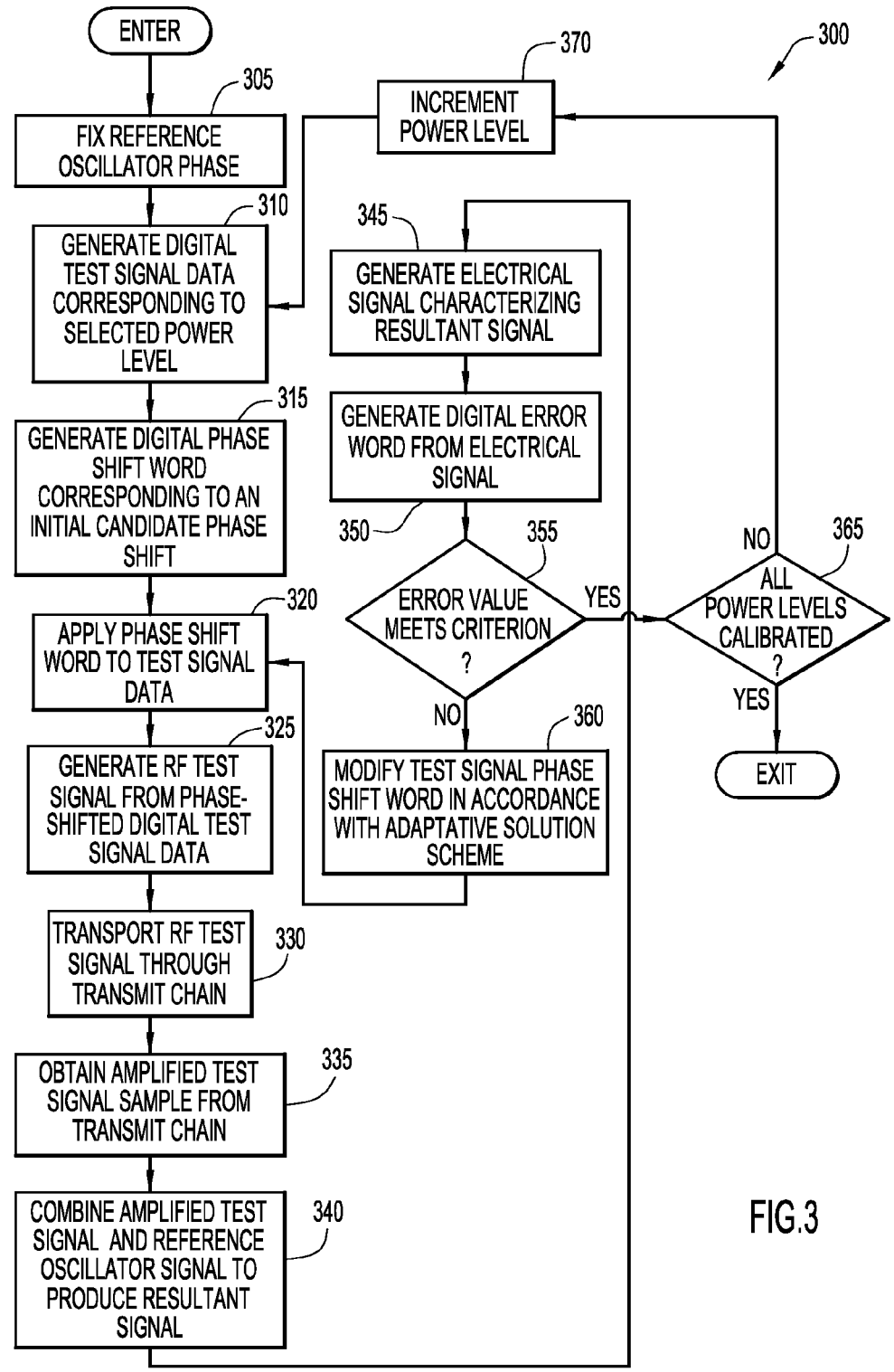
FIG. 3 is a flow diagram of an amplitude modulation to phase modulation (AMPM) predistortion data generating process by which the present general inventive concept can be embodied.

FIG. 3 is a flow diagram of an exemplary AMPM predistortion data generation process 300 by which the present invention can be embodied. In operation 305, the phase offset $\phi$ of the reference oscillator signal is fixed, such as by setting a delay in delay component 185. Additionally, the amplitude of the reference oscillator signal may be set by attenuator 187, although, as stated above, finding the AMPM predistortion data in accordance with the present invention is achieved regardless of any difference in amplitude between reference oscillator signal 188 and amplified test signal 189. In operation 310, digital data are generated, such as by test signal generator 195, that corresponds to a selected power level of power amplifier 140. In operation 315, a digital phase shift data word is set to an initial candidate phase shift and, in operation 320, the phase shift data word is applied to the test signal data, such as by multipliers 107. In operation 325, the phase-shifted test signal data are converted to analog, and upconverted into an RF test signal, which is transported through the transmitter signal processing chain. In operation 335, a sample of the amplified test signal is obtained, such as by coupler 155, which is combined with reference oscillator signal 188 in combiner 190. The output of the combiner is a resultant signal that is an outcome of interference, either constructive or destructive, owing to wave superposition of the amplified test signal 189 and the reference oscillator signal 188. In operation 345, an electrical signal is generated, such as by envelope detector 192, that characterizes the resultant signal and, in operation 350, the electrical signal is converted to a digital word, such as by ADC 194, which may be used as an error value in the adaptive phase shift process of adaptation processor 198. The digital word may first be provided to power averager prior to being conveyed to adaptation processor 198. In operation 355, it is determined whether the value of the digital error word meets an acceptability criterion, which may be established as a minimum error value. If the acceptability criterion is met, e.g., the error word is assigned the minimum error value, process 300 transitions to operation 365, by which it is determined whether all applicable power levels of power amplifier 140 have been calibrated, i.e., each power level of power amplifier 140 is associated with an AMPM predistortion weight. If additional power levels are to be calibrated, process 300 transitions to operation 370, by which the power level is incremented, and then to operation 310, where process 300 is repeated for the new power level. However, if it is determined in operation 355 that the acceptability criterion has not been met, process 300 transitions to operation 360, by which the phase shift data word is modified, such as by the adaptive process of adaptation processor 198, to a new candidate phase shift value. Process 300 then transitions back to operation 320, by which the new candidate phase shift is applied to the test signal and process 300 is repeated from that point.

Certain embodiments of the present general inventive concept provide for the functional components to manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions may be encoded and then subsequently retrieved, decoded and executed by a processor, including electrical, magnetic and optical storage devices. Examples of non-transitory computer-readable recording media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present general inventive concept as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus to generate amplitude modulation to phase modulation (AMPM) predistortion data that compensates for phase distortion in a power amplifier of a communication device, the apparatus comprising:
    a test signal generator to generate a baseband test signal that is upconverted and provided to the power amplifier;
    a reference oscillator to generate a reference oscillator signal;
    a coupler to obtain the amplified test signal from the power amplifier;
    a combiner coupled to the reference oscillator and the coupler to combine, by wave superposition, the amplified test signal and the reference oscillator signal into a resultant signal that is an outcome of interference between the amplified test signal with the reference oscillator signal;
    a measurement circuit to generate a measurement signal that characterizes the resultant signal; and
    a processor coupled to the measurement circuit and configured to:
        determine a predistortion phase shift that when applied to the test signal maximizes the interference between the amplified test signal and the reference oscillator signal as indicated to by the measurement signal; and to
        generate the AMPM predistortion data that corresponds with the predistortion phase shift.

2. The apparatus of claim 1, further comprising:
    a phase shifter to apply a phase shift to the baseband test signal in accordance with phase shift data from the processor; and wherein the processor is configured to:
    generate the phase shift data corresponding to candidate phase shifts of the test signal;
    obtain the measurement signal for each of the candidate phase shifts; and
    establish, as the AMPM predistortion phase shift, the candidate phase shift for which the measurement signal characterizes the maximized interference.

3. The apparatus of claim 2, wherein the processor is further configured to:
    generate the phase shift data to increment the candidate phase shift adaptively based on a gradient in the measurement signal with respect to the candidate phase shift applied by the phase shifter.

4. The apparatus of claim 3, wherein the processor is further configured to:
    compute the increments to the candidate phase shift in accordance with a least mean squares calculation.

5. The apparatus of claim 2, wherein the measurement circuit comprises:
    an envelope detector to generate a voltage indicative of a signal envelope of the resultant signal; and
    an analog-to-digital converter to generate digital data corresponding to the envelope detector voltage, wherein the digital data is provided to the processor as the measurement signal.

6. The apparatus of claim 5, wherein the measurement circuit comprises no more than one envelope detector and no more than one analog-to-digital converter.

7. The apparatus of claim 1, further comprising:
    a memory to store the AMPM predistortion data; and wherein the processor is further configured to:
    modify the baseband test signal to compel amplification by the power amplifier at selected power levels;
    determine the predistortion phase shift for each of the selected power levels; and
    store, in the memory, the AMPM predistortion data corresponding to the predistortion phase shift for each of the power levels.

8. The apparatus of claim 7, wherein the processor is further configured to:
    determine the predistortion phase shift for each of the selected power levels regardless of any difference in amplitude between the amplified test signal and the reference oscillator signal.

9. The apparatus of claim 1, wherein the reference oscillator is a local oscillator of a transmitter in the communication device.

10. The apparatus of claim 1, wherein the reference oscillator is a local oscillator of a receiver in the communication device.

11. The apparatus of claim 1, wherein the coupler and the reference oscillator are coupled to the combiner so that the resultant signal is maximized in correspondence with maximized destructive interference between the amplified test signal with the reference oscillator signal.

12. The apparatus of claim 1, wherein the coupler and the reference oscillator are coupled to the combiner so that the resultant signal is maximized in correspondence with maximized constructive interference between the amplified test signal with the reference oscillator signal.

13. A method of generating amplitude modulation to phase modulation (AMPM) predistortion data that compensates for phase distortion in a power amplifier of a communication device, the method comprising:
    amplifying a test signal via the power amplifier;
    combining, by wave superposition, the amplified test signal and a reference oscillator signal into a resultant signal that is an outcome of interference between the amplified test signal with the reference oscillator signal;
    determining, from measurement of the resultant signal, a predistortion phase shift that when applied to the test signal maximizes the interference between the amplified test signal and the reference oscillator signal; and
    generating the AMPM predistortion data that corresponds with the predistortion phase shift.

14. The method of claim 13, wherein determining the predistortion phase shift comprises:
    applying a candidate phase shift to the test signal;
    measuring the resultant signal produced by the combining of the phase-shifted test signal and the reference oscillator signal;
    adjusting the candidate phase shift incrementally until the measurement of the resultant signal indicates that the interference is maximized; and establishing, as the predistortion phase shift, the candidate phase shift corresponding to the resultant signal that indicates the maximized interference.

15. The method of claim 14, wherein adjusting the candidate phase shift comprises:
   computing the increments to the candidate phase shift adaptively based on a gradient in the measurement of the resultant signal with respect to the applied candidate phase shift.

16. The method of claim 15, wherein computing the increments comprises:
   computing the increments to the candidate phase shift in accordance with a least mean squares calculation.

17. The method of claim 16, wherein measuring the resultant signal comprises:
   generating a single electrical signal characterizing a signal envelope of the resultant signal by a voltage level;
   converting the electrical signal into digital data; and
   providing the digital data as the measurement of the resultant signal.

18. The method of claim 13, further comprising:
   modifying the test signal to compel amplification by the power amplifier at selected power levels;
   determining the predistortion phase shift for each of the selected power levels; and
   storing, in a memory, the AMPM predistortion data corresponding to the predistortion phase shift for each of the power levels.

19. The method of claim 18, wherein determining the predistortion phase shift comprises:
   determining the predistortion phase shift for each of the selected power levels regardless of any difference in amplitude between the amplified test signal and the reference oscillator signal.

20. The method of claim 13, further comprising:
   selecting, as the reference oscillator signal, a local oscillator signal of a transmitter in the communication device or a local oscillator signal of a receiver in the communication device.

* * * * *